(12) United States Patent
Maruyama et al.

(10) Patent No.: US 7,674,634 B2
(45) Date of Patent: Mar. 9, 2010

(54) METHOD OF PRODUCING SEMICONDUCTOR DEVICE

(75) Inventors: Kenji Maruyama, Kawasaki (JP);
Masaki Kurasawa, Kawasaki (JP);
Masao Kondo, Kawasaki (JP);
Yoshihiro Arimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 293 days.

(21) Appl. No.: 10/532,249

(22) PCT Filed: Nov. 5, 2003

(86) PCT No.: PCT/JP03/14123
§ 371 (c)(1),
(2), (4) Date: Apr. 22, 2005

(87) PCT Pub. No.: WO2004/044965
PCT Pub. Date: May 27, 2004

(65) Prior Publication Data
US 2006/0166378 A1    Jul. 27, 2006

(30) Foreign Application Priority Data
Nov. 12, 2002    (JP) .............................. 2002-328382

(51) Int. Cl.
*H01L 21/8246*    (2006.01)
(52) U.S. Cl. ........................... 438/3; 438/399; 257/306; 257/E21.664; 365/145
(58) Field of Classification Search .............. 438/3, 438/458, 399; 257/295, 306, E21.664; 365/145
See application file for complete search history.

(56) References Cited

U.S. PATENT DOCUMENTS 5,037,774 A * 8/1991 Yamawaki et al. ............. 117/8

(Continued)

FOREIGN PATENT DOCUMENTS

JP    6-196648    7/1994

(Continued)

OTHER PUBLICATIONS

Patent Abstracts of Japan, Publication No. 8-186235, Takeshi et al., Jul. 16, 1996.*

(Continued)

*Primary Examiner*—Steven J Fulk
(74) *Attorney, Agent, or Firm*—Kratz, Quintos & Hanson, LLP

(57) ABSTRACT

A semiconductor device incorporating a capacitor structure that includes a ferroelectric thin film is obtained by forming, on a single crystalline substrate 10 having a surface suited for growing thereon a thin film layer of ferroelectric single crystal having a plane (111), a ferroelectric single crystalline thin film 12' containing Pb and having a plane (111) 11 in parallel with the surface of the substrate (or a ferroelectric polycrystalline thin film containing Pb and oriented parallel with the plane (111) in parallel with the surface of the substrate) and part 16 of a circuit of a semiconductor device, to thereby fabricate the single crystalline substrate 10 having said ferroelectric thin film containing Pb and said part of the circuit of the semiconductor device; and bonding said single crystalline substrate 10 to another substrate on which the other circuit of the semiconductor device has been formed in advance, to couple the two circuits together.

The capacitor in the semiconductor device thus obtained includes a ferroelectric thin film having a large amount of polarizing charge. The semiconductor device can be used as a highly reliable nonvolatile memory.

11 Claims, 5 Drawing Sheets

U.S. PATENT DOCUMENTS

| | | | |
|---|---|---|---|
| 5,070,026 | A * | 12/1991 | Greenwald et al. ............ 438/3 |
| 5,940,705 | A * | 8/1999 | Lee et al. .................... 438/258 |
| 6,333,202 | B1 | 12/2001 | Adkisson et al. |
| 6,396,094 | B1 * | 5/2002 | Mirkarimi et al. .......... 257/295 |
| 2001/0006254 | A1 * | 7/2001 | Li .............................. 257/742 |
| 2003/0103371 | A1 * | 6/2003 | Kim et al. .................. 365/145 |

FOREIGN PATENT DOCUMENTS

| | | |
|---|---|---|
| JP | 6-342920 | 12/1994 |
| JP | 8-227980 | 9/1996 |
| JP | 2001-102543 | 4/2001 |
| JP | 2002-16229 | 1/2002 |
| JP | 2002-76295 | 3/2002 |

OTHER PUBLICATIONS

Patent Abstracts of Japan, Publication Number 8-186235, dated Jul. 16, 1996.

Patent Abstracts of Japan, Publication Number 8-227980, dated Sep. 3, 1996.

L. Tsakalakos, et al.; "Excimer Laser Liftoff of Epitaxial Pb(Zr,Ti)O$_3$ Thin Films and Heterostructures;" *Mat. Res. Soc. Symp. Proc.;* vol. 596; 2000; pp. 549-556.

B. K. Moon, et al.; Characteristics of ferroelectric Pb(Zr,Ti)O$_3$ films epitaxially grown on CeO$_2$(111)/Si(111) substrates; *Thin Solid Films*; vol. 385; 2001; pp. 307-310.

K. Saito, et al., "Crystal domain structures of epitaxial grown PB (Zr$_x$Ti$_{1-x}$)O$_3$ thin films", Extended Abstracts of the Japan Society of Applied Physics, 2000 Autumn 2, Japan Society of Applied Physics, Sep. 2000, p. 441, 5P-G-10.

Japanese Office Action dated Aug. 25, 2009.

* cited by examiner

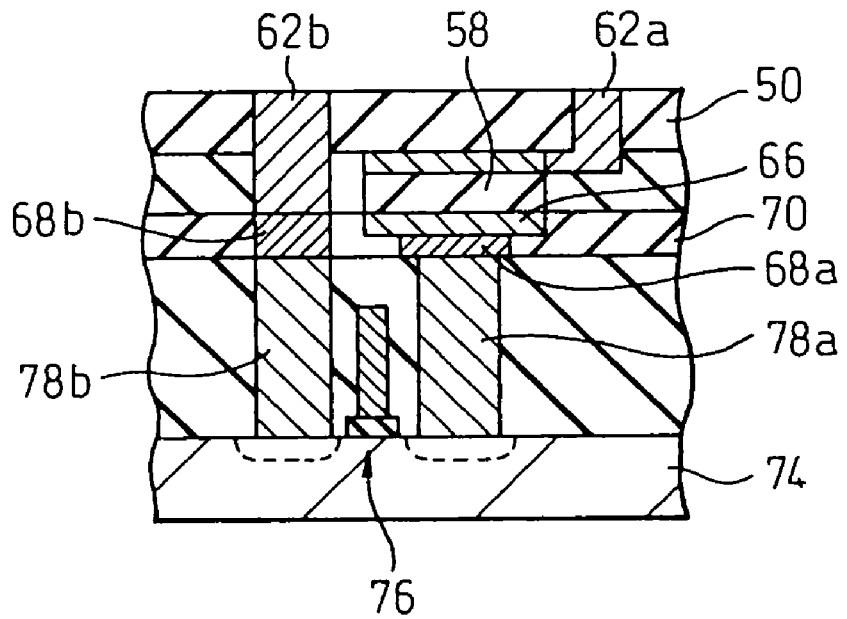
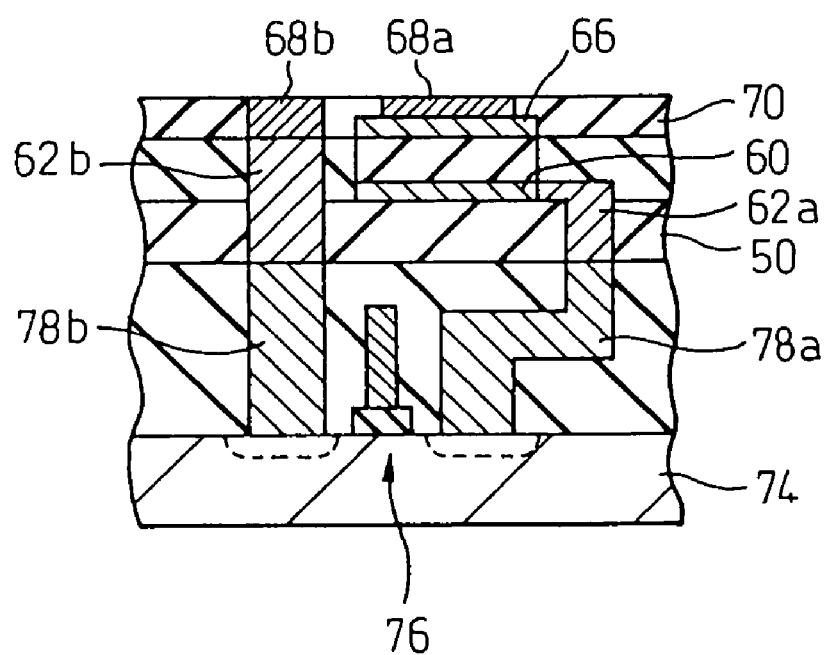

METHOD OF PRODUCING SEMICONDUCTOR DEVICE

CROSS-REFERENCE TO RELATED APPLICATIONS

This application is based upon and claims priority of Japanese Patent Application No. 2002-328382 filed on Nov. 12, 2002, the contents thereof being incorporated herein by reference.

TECHNICAL FIELD

The present invention relates to a semiconductor device and, particularly, to a method of producing a semiconductor device having a capacitor structure which includes a ferroelectric thin film.

BACKGROUND ART

There are various known semiconductor devices, such as semiconductor memories. Among these memory devices, those that hold data even when the power source is turned off are called nonvolatile memories. Among the nonvolatile memories, one using a ferroelectric material as a capacitor material for holding the electric charge is called ferroelectric memory (Ferroelectric Random Access Memory (FRAM, registered trademark)).

The FRAM utilizes two residual polarizing properties of dissimilar polarities possessed by a ferroelectric thin film, and holds data even when the power source is turned off. The possible number of times of rewriting, which is an indication of nonvolatile property, is as great as $1\times10^{10}$ to $1\times10^{12}$ times. The rewriting speed is in the order of several tens of nanoseconds, a very high speed.

In the FRAM, the ferroelectric material used for forming a capacitor can be polarized in one of the two directions. By distinguishing the direction of polarization, it is possible to store the data "1" corresponding to one direction of polarization and the data "0" corresponding to the opposite direction of polarization. When the dielectric material in the capacitor is not a ferroelectric material but is a paradielectric material, the polarization is maintained only when there is a potential difference from the electrodes but is not maintained when the potential difference is removed. In this case, therefore, a volatile operation is brought about. The direction of polarization of the ferroelectric material in the FRAM can be detected by applying a potential large enough for switching over the polarization of the capacitor.

The ferroelectric materials used in the FRAM include a lead-based ferroelectric material and a bismuth-based ferroelectric material. Representative lead-based ferroelectric materials are PZT ($PbZr_xTi_{1-x}O_3$), PLZT ($Pb_yLa_{1-y}Zr_xTi_{1-x}O_3$), etc. A representative bismuth-based ferroelectric material is SBT ($SrBi_2Ta_2O_9$).

Concerning the ferroelectric material used in the FRAM, Japanese Unexamined Patent Publication (Kokai) No. 13-102543 teaches the use of a single crystalline ferroelectric thin film, as a ferroelectric material, for forming a capacitor in the FRAM. This publication, however, does not teach the method of producing semiconductor devices by using a single crystalline ferroelectric thin film grown on a single crystalline substrate, as in the present invention.

Japanese Unexamined Patent Publication (Kokai) No. 11-103024 teaches a semiconductor device of the structure in which a ferroelectric thin film (oriented polycrystalline thin film), having a plurality of crystalline particles arranged as a layer, is formed on the lower electrode in which crystals constituting a surface that comes in contact with the thin film are arranged on a plane (111).

Further, Foster et al., Journal of Applied Physics, 81, 2324, 1997, reports a thin PZT film having a large residual polarization charge (2Pr) obtained by forming (001) $SrRuO_3$ as a lower electrode on (001) $SrTiO_3$ and then forming a thin PZT (001) film by the MOCVD method.

A system LSI using a ferroelectric material for forming the capacitor as mentioned above must have very highly reliable, since it is used in equipment that deals with money data and data on individuals, such as IC cards, smart cards, etc. To realize a service life of ten years, as expected for these system LSIs, it is desired that the polarizing charge of the ferroelectric capacitor is as large as possible. With the ferroelectric capacitors fabricated by the conventional sputtering method, however, the amount of polarizing charge was mostly from 20 to 25 $\mu C/cm^2$, and it was difficult to obtain, maintaining a high yield, ferroelectric capacitors satisfying the amount of polarizing charge of 30 $\mu C/cm^2$ that is necessary for practical products. It is even more difficult to obtain a ferroelectric capacitor having the amount of polarizing charge of not smaller than 35 $\mu C/cm^2$ necessary for improving the reliability of the product.

DISCLOSURE OF THE INVENTION

It is an object of the present invention to provide a method which makes it possible to produce a highly reliable semiconductor device incorporating a capacitor structure that includes a ferroelectric thin film having a large amount of polarizing charge.

According to the method of producing a semiconductor device of the present invention, use is made of a single crystalline thin film material having a plane (111) or a polycrystalline thin film material oriented parallel to a plane (111) as a ferroelectric crystalline material, and electrodes are formed on both surfaces thereof, to produce semiconductor devices including a capacitor having a residual polarizing amount greater than that of the conventional capacitors using the oriented polycrystalline thin film.

Specifically, the present invention is concerned with a method of producing a semiconductor device incorporating a capacitor structure that includes a ferroelectric thin film, characterized by:

forming, on a single crystalline substrate having a surface suited for growing thereon a thin film layer of ferroelectric single crystal having a plane (111), a ferroelectric single crystalline thin film containing Pb and having a plane (111) in parallel with the surface of the substrate or a ferroelectric polycrystalline thin film containing Pb and oriented parallel with the plane (111) in parallel with the surface of the substrate, and part of a circuit of a semiconductor device, to thereby fabricate a single crystalline substrate having said ferroelectric thin film containing Pb and said part of the circuit of the semiconductor device; and bonding said single crystalline substrate to another substrate on which the other circuit of the semiconductor device has been formed in advance, to couple the two circuits together to thereby obtain a semiconductor device incorporating a capacitor structure that includes a ferroelectric thin film.

According to one embodiment of the present invention, there is provided a method of producing a semiconductor device incorporating a capacitor structure that includes a ferroelectric thin film, comprising:

(1) forming, on a single crystalline substrate, a ferroelectric single crystalline thin film layer containing Pb and having a plane (111) in parallel with the surface of the substrate, patterning said thin film layer to thereby form isolated ferroelectric thin films of a predetermined shape on the single crystalline substrate, forming one electrode of a capacitor of a predetermined shape positioned on said ferroelectric thin film, and forming part of a circuit of a semiconductor device on the single crystalline substrate, to thereby fabricate a single crystalline substrate having thereon said ferroelectric thin film containing Pb, said one electrode and said part of the circuit of the semiconductor device;

(2) fabricating a semiconductor substrate having the other circuit of the semiconductor device formed;

(3) bonding said single crystalline substrate to said semiconductor substrate to couple the circuits of the two substrates together; and (4) removing said single crystalline substrate to expose the ferroelectric thin film, and forming another electrode of the capacitor on the ferroelectric thin film that is exposed.

According to another embodiment of the present invention, there is provided a method of producing a semiconductor device incorporating a capacitor structure that includes a ferroelectric thin film, comprising:

(1) forming an electrically conducting thin film layer on a single crystalline substrate having through holes, forming, on said electrically conducting thin film layer, ferroelectric single crystalline thin film layer containing Pb and having a plane (111) in parallel with the surface of the substrate, or a ferroelectric polycrystalline thin film layer containing Pb and oriented parallel with the plane (111) in parallel with the surface of the substrate, patterning said electrically conducting thin film layer and said ferroelectric thin film layer to thereby form isolated ferroelectric thin films of a predetermined shape and one electrode of a capacitor of a predetermined shape, forming another electrode of the capacitor on said ferroelectric thin film, and forming part of a circuit of a semiconductor device so as to pass through the holes in said single crystalline substrate, to thereby fabricate a single crystalline substrate comprising a capacitor structure constituted by said ferroelectric thin film containing Pb and a pair of electrodes holding the ferroelectric thin film therebetween, and said part of the circuit of the semiconductor device;

(2) fabricating a semiconductor substrate having the other circuit of the semiconductor device formed; and (3) bonding said single crystalline substrate to said semiconductor substrate to couple the circuits of the two substrates together.

In the method of the present invention, a dielectric thin film of the capacitor is formed from a ferroelectric material containing lead (Pb). As the ferroelectric material containing Pb, there can be used PZT ($PbZr_xTi_{1-x}O_3$), PLZT ($Pb_yLa_{1-y}Zr_xTi_{1-x}O_3$), PLCSZT ($(Pb, La, Ca, Sr)(Zr, Ti)O_3$) or a substance derived therefrom by adding Nb thereto.

As the single crystalline substrate for forming the ferroelectric thin film thereon, there can be used a single crystalline substrate having a plane (111) on which the ferroelectric thin film is formed, or a single crystalline substrate having an offset angle from the plane (111). In general, use of the single crystalline substrate having an offset angle increases the flatness of the surface of the grown crystals. As a typical example of the single crystalline substrate having the plane (111), there can be exemplified an MgO or $SrTiO_3$ single crystalline substrate.

Alternatively, as the single crystalline substrate for forming the ferroelectric thin film thereon, there may be used an $\alpha$-$Al_2O_3$ single crystalline substrate having a plane (0001) (C-plane) on which the ferroelectric thin film is to be formed, or an $\alpha$-$Al_2O_3$ single crystalline substrate having an offset angle from the plane (0001). There may be also used an $MgAl_2O_4$ (magnesia spinel) single crystalline substrate having a plane (001) on which the ferroelectric thin film is to be formed.

When the above-mentioned substrate (MgO, $SriO_3$, $\alpha$-$Al_2O_3$ or $MgAl_2O_4$ single crystalline substrate) for forming the ferroelectric thin film is to be used, there may be formed an electrically conducting thin film, that serves as one electrode of the capacitor, on the substrate prior to forming the ferroelectric polycrystalline thin film layer. The electrically conducting thin film can be formed from Pt, Ir, Ti, Ru or an oxide thereof, and the plane (111) thereof can be used as the surface on which the ferroelectric thin film is formed.

Alternatively, as the single crystalline substrate for forming the ferroelectric thin film thereon, there can be used a single crystalline silicon substrate having a plane (111) on which the ferroelectric thin film is to be formed, or having a plane equivalent thereto, i.e., having a plane {111}, or a single crystalline silicon substrate having an offset angle from the plane {111}. Also, there may be used a single crystalline silicon substrate having a plane {100} on which the ferroelectric thin film is to be formed, or a single crystalline silicon substrate having an offset angle from the plane {100}.

When such a single crystalline silicon substrate is used, the ferroelectric thin film can be epitaxially grown on the ferroelectric thin film-forming surface of the substrate directly, or through a buffer layer formed thereon. Use of the buffer layer is effective in preventing the formation of silicide during the formation of the ferroelectric thin film. The buffer layer may be formed of MgO, YSZ (yttrium-stabilized zirconia ($ZrO_2$)), $MgAl_2O_4$, CaO, $SrTiO_3$, $CeO_2$ or the like, the plane (111) or the plane (0001) of which can be used for the formation of the ferroelectric thin film.

When the single crystalline silicon substrate is used and the ferroelectric thin film is formed on the ferroelectric thin film-forming surface of the substrate directly or through the buffer layer, an electrically conducting thin film that serves as one electrode of the capacitor may be formed on the substrate or on the buffer layer prior to forming the ferroelectric polycrystalline thin-film layer. The electrically conducting thin film can be formed of Pt, Ir, Ti, Ru or an oxide thereof, and the plane (111) thereof can be used as the surface on which the ferroelectric thin film is formed. Also, an alloy of these metal elements can be used. Further, a plurality of layers of the above metals or of the alloys thereof may be stacked. Alternatively, the electrically conducting thin film may be formed of $SrRuO_3$, YBCO or LSCO, and the plane (111) thereof may be used as the surface for forming the ferroelectric thin film.

BRIEF DESCRIPTION OF THE DRAWINGS

FIG. 4 illustrates a semiconductor device produced by turning the single crystalline substrate having the capacitor of Example 2 formed upside down and bonding it to a silicon substrate having a semiconductor circuit formed;

FIG. 5 illustrates a semiconductor device produced without turning the single crystalline substrate having the capacitor of Example 2 formed upside down but bonding it to the silicon substrate having the semiconductor circuit formed.

BEST MODE FOR CARRYING OUT THE INVENTION

In the present invention, there is formed, on a singe crystalline substrate, a ferroelectric single crystalline thin film layer having a plane (111) in parallel with the surface of the substrate and containing Pb. Foster et al., Journal of Applied Physics, 81, 2324, 1997 reports that when (001) SrRuO$_3$ was formed as a lower electrode on (001) SrTiO$_3$ and a PZT thin film having a plane (001) was then formed by an organometal chemical vapor phase deposition (MOCVD) method, the thin film had a residual polarization charge amount (2Pr) of as large as 110 μC/cm$^2$. This shows that if calculated on the plane (111), the amount of residual polarization charge becomes 63 μC/cm$^2$ which is more than twice as great as 30 μC/cm$^2$ needed for the practical products as described above.

When, for example, a PZT material is used as the ferroelectric material, the axis of polarization exists in the (001)-direction when the type of crystals is cubic. When the plane (111) of the ferroelectric thin film single crystal is formed on the electrode, the axis <111> perpendicular to the surface of the electrode has an angle of 35.3° with respect to the axis of polarization <001>. The polycrystalline ferroelectric thin film has a domain structure of 30 to 100 nm, and exhibits only a small amount of polarization charge as compared to that of the single crystalline thin film due to fluctuation in the azimuth of the axis of polarization.

Therefore, by forming, on the single crystalline structure, a ferroelectric single crystalline thin film layer having a plane (111) in parallel with the surface of the substrate, etching the thin film layer to thereby form isolated ferroelectric thin films of a predetermined shape on the single crystalline substrate, forming electrodes on both surfaces of the thin film, and bonding the single crystalline substrate to another substrate on which a semiconductor circuit has been formed to couple the two circuits together, there can be produced a highly reliable semiconductor device incorporating a capacitor which includes a single crystalline ferroelectric thin film exhibiting the amount of polarizing charge which is no smaller than twice as large as the amount of polarizing charge, 30 μC/cm$^2$, of the conventional oriented polycrystalline thin films.

The semiconductor device produced according to the present invention has a large amount of polarization charge per a unit area of the ferroelectric thin film used for the capacitor and, accordingly, makes it possible to secure a required amount of polarizing charge even if the capacitor area is decreased. This makes it possible to carry out microfabrication according to the rule of scaling and, hence, to produce a semiconductor device having a high degree of integration at a decreased cost while maintaining high performance.

EXAMPLES

The invention will now be further described by way of examples to which, however, the invention is in no way limited.

Example 1

Figure 1A:
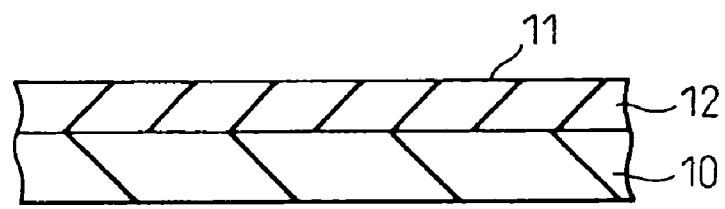
FIGS. 1A to 1E illustrate the steps in the former half of the method of producing semiconductor devices of Example 1.

As shown in FIG. 1A, a single crystalline PZT layer 12 is epitaxially grown on a single crystalline substrate 10, the single crystalline PZT layer 12 having a plane (111) 11 in parallel with the surface of the substrate 10. As the single crystalline substrate 10, there can be used a substrate having, for example, a MgO plane (111), an SrTiO$_3$ plane (111) or an α-Al$_2$O$_3$ plane (0001).

The single crystalline PZT (111) can be epitaxially grown by an organometal chemical vapor phase deposition (MOCVD) method, a molecular beam epitaxy (MBE) method or a pulse laser deposition (PLD) method. The film-forming methods are not limited thereto. Also, by not being limited to PZT (PbZr$_x$Ti$_{1-x}$O$_3$), there can be used such ferroelectric material as PLZT (Pb$_y$La$_{1-y}$Zr$_x$T$_{1-x}$O$_3$), PLCSZT ((Pb, La, Ca, Sr)(Zr, Ti)O$_3$), as well as a material derived therefrom by adding Nb thereto.

For example, the formation of PZT film by the MOCVD method can be carried out by using Pb(THD)$_2$, Zr(THD)$_4$ and Ti(i-PrO)$_2$(THD)$_2$ as starting materials at a substrate temperature of 550 to 600° C. and a pressure of 130 to 670 Pa (1 to 5 Torr). In the formulas of these starting compounds, THD stands for a trimethylhexane dionate, and i-PrO stands for an isopropoxy.

Figure 1B:
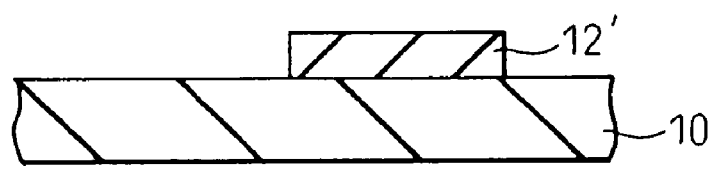
Figure 1C:
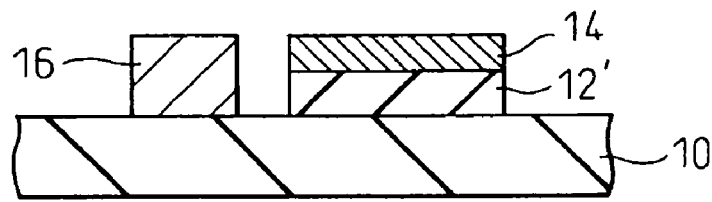

The thin film layer 12 having the flat PZT plane (111) 11 is formed on the whole surface of the substrate 10 and is, then, etched leaving the thin film 12' in a region in which a thin-film capacitor is to be made (FIG. 1B). On the PZT thin film 12', that is left, is formed a lower electrode 14 (which will be turned upside down when it is to be bonded to another substrate at a subsequent step) by a thin film of Pt or Ir material. On the substrate 10 is formed a plug 16 of tungsten (FIG. 1C) which will be a part of the circuit of a semiconductor device and is an interconnection connected to another substrate (semiconductor substrate) to which the substrate is to be bonded later.

Figure 1D:
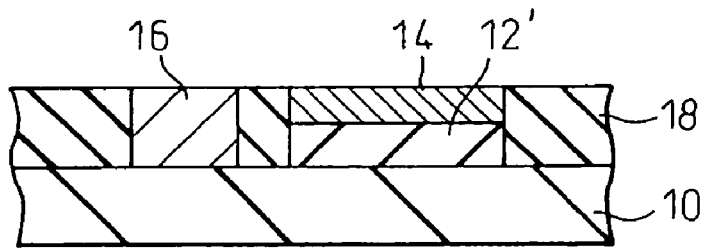
Figure 1E:
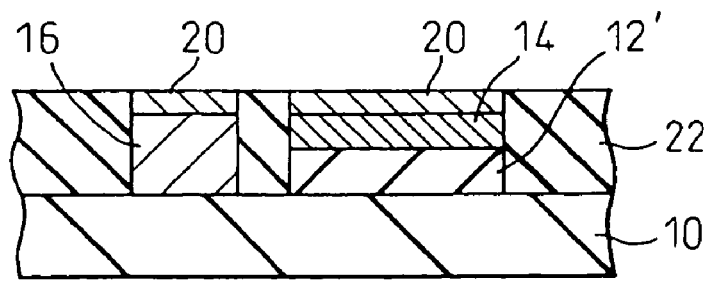

Next, a layer of an insulating material such as TEOS is formed on the substrate 10, and the surface thereof is planarized by a planarization method such as CMP to form an insulating film 18 (FIG. 1D). Thereafter, thin tungsten films 20 are formed on the lower electrode 14 and on the tungsten plug 16, and the TEOS insulating layer is formed again and is then planarized to thereby form an interlayer insulating film 22 (FIG. 1E).

Figure 2A:
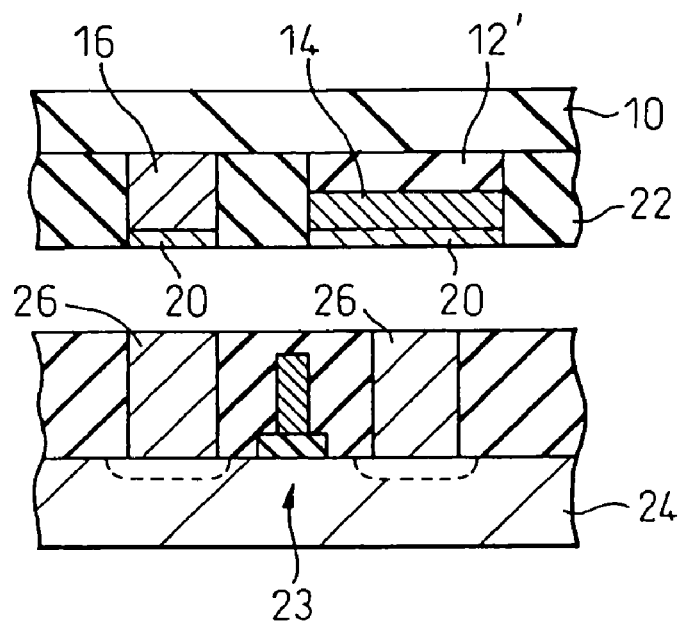
FIGS. 2A to 2C illustrate the steps in the latter half of the method of producing semiconductor devices of Example 1.
Figure 2B:
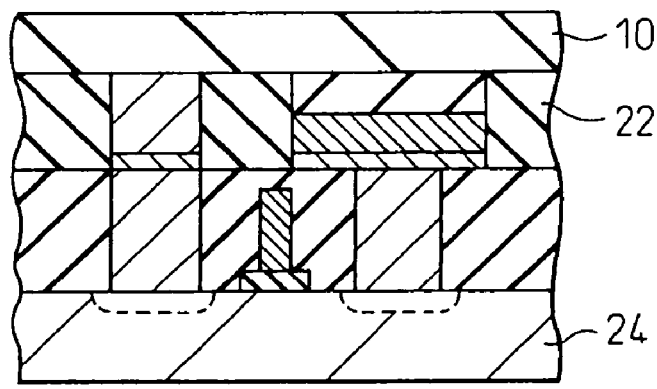

As shown in FIG. 2A, the substrate 10 on which the ferroelectric PZT thin film 12' for capacitor is formed, is turned upside down so as to face a semiconductor substrate 24 on which there has been formed, in advance, a transistor 23 as part of the circuit of the semiconductor device. Subsequently, as shown in FIG. 2B, the substrate 10 is intimately adhered to the substrate 24 so that the thin tungsten film 20 of the substrate 10 is joined to the interconnecting electrode 26 of the transistor of the substrate 22, followed by the heat treatment to bond the two substrates together and to mechanically and electrically couple them together. Techniques for bonding two pieces of substrates in the form of wafers by the heat treatment have been disclosed in, for example, Japanese Unexamined Patent Publications (Kokai) Nos. 2-303114 and 1-115143.

Next, the substrate 10 used for forming the ferroelectric PZT thin film 12' for the capacitor is removed. The substrate 10 is removed by chemical dissolution using HCl when the substrate 10 is an MgO substrate. In the case of an SrTiO$_3$ substrate, it is chemically dissolved using a mixed acid of HNO$_3$, HF and HCl. A sapphire (α-Al$_2$O$_3$) substrate can be dissolved only with molten KOH and, therefore, it is mechanically removed using an SiC abrasive or is. mechanically and chemically removed using colloidal silica.

Figure 2C:
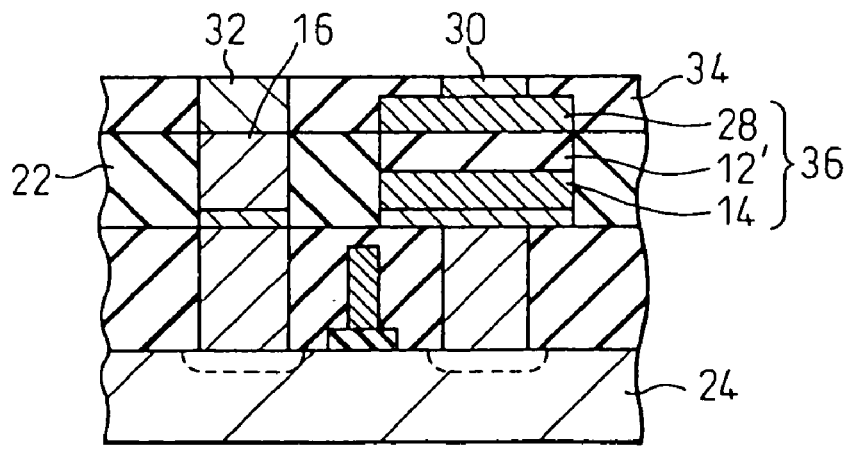

Finally, as shown in FIG. 2C, there are formed an upper electrode 28 of the capacitor, a thin tungsten film 30 connected thereto, another tungsten plug 32 connecting to the tungsten plug 16, and an interlayer insulating film 34 in the same manner as described above, to thereby provide a semiconductor device having a ferroelectric capacitor 36 constituted of the lower electrode 14, ferroelectric PZT thin film 12' and upper electrode 28. The upper electrode 28 can be formed using, for example, Ir or $IrO_2$.

Example 2

This example illustrates the production of a semiconductor device incorporating a ferroelectric capacitor by forming a PZT thin film on the plane (0001) of a sapphire ($\alpha$-$Al_2O_3$) substrate having through holes formed.

Figure 3A:
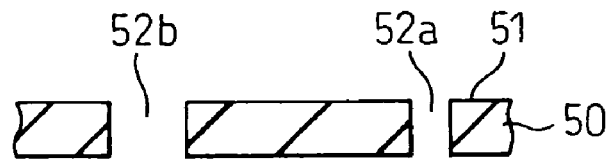
FIGS. 3A to 3F illustrate the fabrication of a single crystalline substrate having a capacitor used in the production of the semiconductor devices of Example 2 formed.

As shown in FIG. 3A, through holes 52a, 52b are perforated in a sapphire ($\alpha$-$Al_2O_3$) single crystalline substrate 50 having a plane (0001) 51 as the upper surface. The through hole 52a is for forming a plug that will connect to one electrode of the capacitor and the through hole 52b is for forming a plug that will serve as an interconnection to be connected to a semiconductor substrate (circuit board) that is to be bonded later. These through holes may be perforated by machining the sapphire substrate 50, or by a dry etching method using a reactive gas or an ionic milling method using Ar ions, or by chemical etching using molten KOH.

Figure 3B:
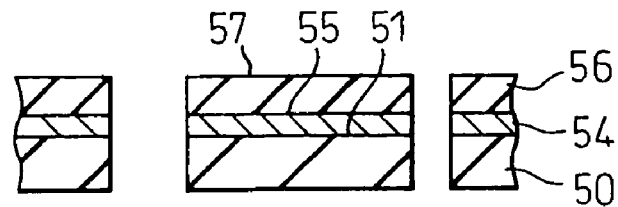
Figure 3C:
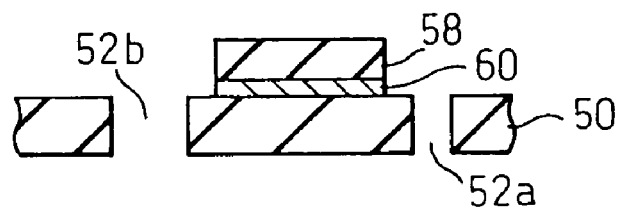

As shown in FIG. 3B, a thin film 54 is formed on the plane (0001) 51 of the substrate 50, the thin film 54 having a plane (111) 55 in parallel with the plane 51. The thin film 54 will form one electrode of the ferroelectric capacitor, and can be formed of Pt or Ir. On the thin film 54 is further formed a PZT thin film 56 having a plane (111) 57 in parallel with the plane (0001) 51 of the substrate 50. The PZT thin film grown on the Pt plane (111) or on the Ir plane (111) has a lattice constant that does not correspond with that of the Pt or Ir crystal, and is therefore not formed as a complete single crystal but as a polycrystalline thin film (polycrystalline thin film oriented parallel with the plane (111)) which is strongly oriented. A single crystalline PZT thin film can be obtained if there is used an $SrRuO_3$ thin film instead of the Pt or Ir thin film. Next, as shown in FIG. 3C, thin films 56 and 54 (FIG. 3B) are removed but leaving a portion that will forms a ferroelectric thin film 58 of the capacitor and a portion that forms an electrode 60.

Figure 3D:
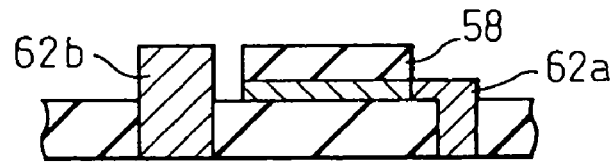

As shown in FIG. 3D, the through holes 52a and 52b (FIG. 3C) are filled with tungsten, and a plug 62a of tungsten extending from the tungsten in the through hole 52a is formed to be connected to the electrode 60. Tungsten material in a columnar form is extended from the top of the tungsten in the through hole 52b, to form a plug 62b that will form an interconnection to be connected to the semiconductor substrate that is bonded subsequently.

Figure 3E:
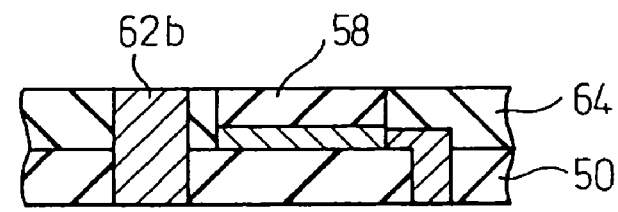
Figure 3F:
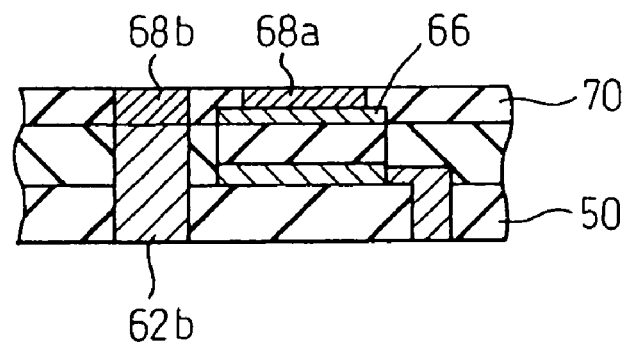

A layer of an insulating material such as TEOS is formed on the substrate 50, and the surface thereof is planarized to form an insulating film 64 (FIG. 3E). Next, as shown in FIG. 3F, another electrode 66 of a Pt or Ir thin film is formed on the ferroelectric thin film 58, the electrode 66 having a plane (111) in parallel with the surface of the substrate 50. Thin tungsten films 68a and 68b are formed on the electrode 66 and on the tungsten plug 62b, respectively. A TEOS insulating layer is formed again and is then planarized to form an interlayer insulating film 70 (FIG. 3F).

In this example, the substrate 50 having the capacitor formed, the capacitor being constituted by the ferroelectric thin film 58 and the two electrodes 60 and 66 holding it therebetween, can be turned upside down, and can be bonded to the another substrate in which the transistor has been formed in advance, or can be bonded thereto without being turned upside down. When the substrate 50 is turned upside down as shown in FIG. 4, the electrode 66 of the capacitor forms the lower electrode and is connected, through the thin tungsten film 68a, to one interconnecting electrode 78a of the transistor 76 formed in the another substrate (semiconductor substrate) 74, and the tungsten plug 62b is connected to the another interconnecting electrode 78b through the thin tungsten film 68b. When the substrate 50 is not turned upside down as shown in FIG. 5, the electrode 60 of the capacitor forms the lower electrode and is connected, through the tungsten plug 62a, to one interconnecting electrode 78a of the transistor 76 of the another substrate 74, and the tungsten plug 62b is connected to the another interconnecting electrode 78b.

Example 3

This example illustrates the production of a semiconductor device incorporating a ferroelectric capacitor by forming a PZT thin film on the plane (111) of the silicon substrate having through holes formed.

Figure 6A:
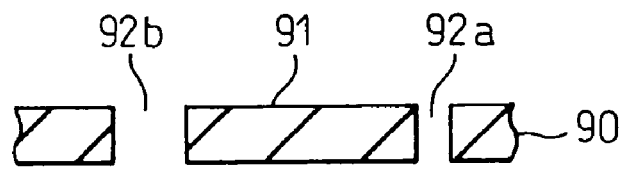
FIGS. 6A to 6F illustrate the fabrication of a single crystalline substrate having a capacitor to be used for the production of semiconductor devices of Example 3 formed.

As shown in FIG. 6A, through holes 92a, 92b are perforated in a silicon substrate 90 having a plane (111) 91 as an upper surface. The through hole 92a is for forming a plug that will connect to one electrode of the capacitor and the through hole 92b is for forming a plug that will serve as an interconnection to be connected to a semiconductor substrate that is to be bonded later. These through holes may be perforated by machining the silicon substrate 90, or by a dry etching method using a reactive gas or an ionic milling method using Ar ions, or by chemical etching using a mixed acid of HF and $HNO_3$.

Figure 6B:
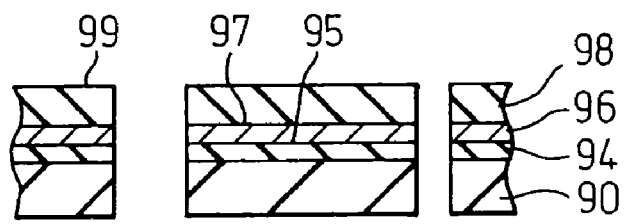

As shown in FIG. 6B, a thin $MgAl_2O_4$ film 94 is formed on the plane (111) 91 of the substrate 90, the thin film 94 having a plane (111) 95 in parallel with the plane 91. The thin film 94 serves as a buffer layer for forming thereon a PZT thin film having a plane (111) in parallel with the plane (111) 91 of the substrate 90, and has the function of preventing the formation of silicide during the formation of the PZT thin film. Then, a thin film 96 that will serve as one electrode of the ferroelectric capacitor is formed of Pt or Ir on the thin film 94. The thin film 96, too, has a plane (111) 97 in parallel with the plane (111) 91 of the substrate 90. On the thin film 96 is further formed a PZT thin film 98 having a plane (111) 99 in parallel with the plane (111) 91 of the substrate 90.

Figure 6C:
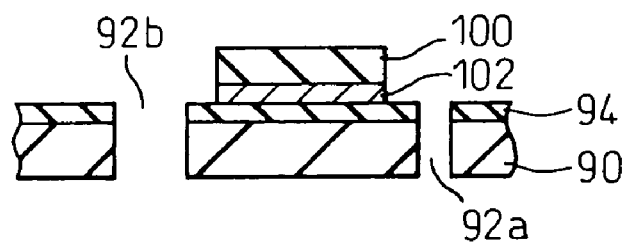

Next, as shown in FIG. 6C, thin films 98 and 96 (FIG. 6B) are removed but leave a portion that forms a ferroelectric thin film 100 of the capacitor and a portion that forms an electrode 102.

Figure 6D:
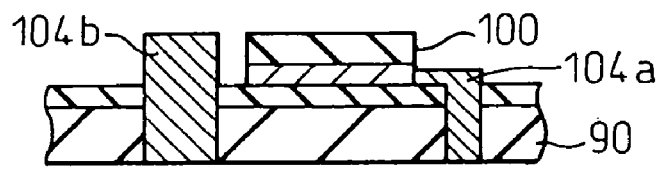

Subsequently, as shown in FIG. 6D, the through holes 92a and 92b (FIG. 6C) are filled with tungsten, and a plug 104a of tungsten extending from the tungsten in the through hole 92a is formed to be connected to the electrode 102. Tungsten material in a columnar form is extended from the top of the tungsten in the through hole 92b to form a plug 104b that will form an interconnection to be connected to the semiconductor substrate that is bonded subsequently.

Figure 6E:
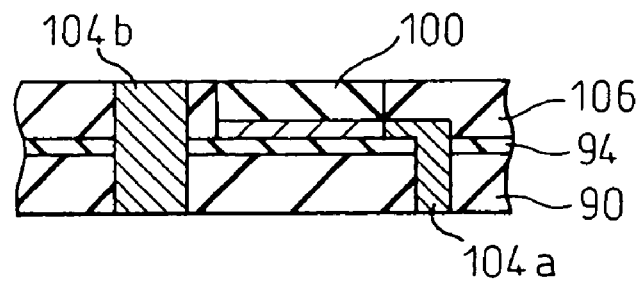
Figure 6F:
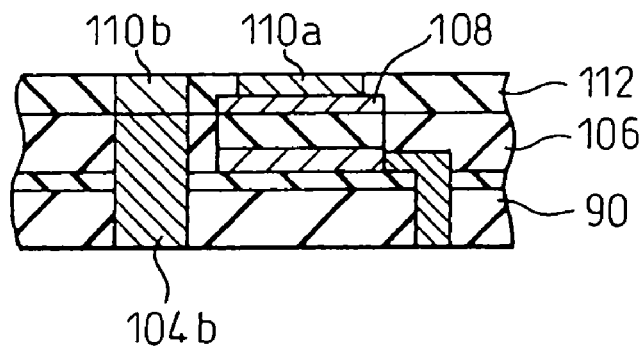

A layer of an insulating material such as TEOS is formed on the substrate 90, and the surface thereof is planarized to form an insulating film 106 (FIG. 6E). Next, as shown in FIG. 6F, another electrode 108 of a Pt or Ir thin film is formed on the ferroelectric thin film 100, the electrode 108 having a plane (111) in parallel with the surface of the substrate 90. Thin tungsten films 110a and 110b are formed on the electrode 108 and on the tungsten plug 104*b*, respectively. A TEOS insulating layer is formed again and is then planarized to form an interlayer insulating film 112 (FIG. 6F).

In this example, too, as described in example 2, the substrate 90 having the capacitor formed, the capacitor being constituted by the ferroelectric thin film 100 and the two electrodes 102 and 108 holding it therebetween, can be turned upside down and be bonded to the another substrate in which the transistor has been formed in advance, or can be bonded thereto without being turned upside down.

Example 4

This Example illustrates the production of a semiconductor device incorporating a ferroelectric capacitor by forming a PZT thin film on the plane (001) of the silicon substrate having through holes formed, the PZT thin film having a plane (111) in parallel with the plane (001).

In the same manner as described in the example 3, in the silicon substrate having the plane (001) as an upper surface are perforated a through hole for forming a plug that will connect to one electrode of the capacitor and a through hole for forming a plug that will serve as an interconnection to be connected to a semiconductor substrate that is to be bonded subsequently.

In general, a thin oxide film (native oxide) exists on the surface of a silicon substrate. Here, a thin $MgAl_2O_4$ film is formed on the plane (001) of the silicon substrate on which the oxide film is left. The thin $MgAl_2O_4$ film formed on the Si plane (001) where the thin oxide film is present, is a film possessing a plane (111), which forms a buffer layer for forming thereon a PZT thin film that has a plane (111) in parallel with the surface (thin film-forming surface) of the silicon substrate as described in example 3, and can prevent the formation of silicide during the formation of the PZT thin film.

Subsequently, a capacitor is formed on the silicon substrate according to the procedure earlier described in example 3. The substrate is bonded to another substrate in which the transistor has been formed in advance, to thereby produce a semiconductor device incorporating the ferroelectric PZT capacitor.

INDUSTRIAL APPLICABILITY

The semiconductor device of the invention uses a single crystal having a surface of plane (111) which is perpendicular to the axis <111> having an angle of 35.3° with respect to the axis of polarization, as a ferroelectric thin film for a capacitor. The single crystalline ferroelectric thin film has an amount of polarizing charge that is calculated to be 63 $\mu C/cm^2$, which is not smaller than two times as much, 30 $\mu C/cm^2$, as that of the conventional oriented polycrystalline thin film. Owing to its large amount of residual polarization, a very high degree of reliability is exhibited by a system LSI that incorporates, as nonvolatile memories, the semiconductor devices that are obtained by utilizing the present invention.

Besides, the semiconductor device obtained by the present invention has a large amount of polarizing charge per a unit area, making it possible to secure a required amount of polarization charge even when the capacitor area is decreased. This makes it possible to carry out microfabrication according to the rule of scaling and, hence, to produce a semiconductor device having a high degree of integration at a decreased cost while maintaining high performance.

The invention claimed is:

1. A method of producing a semiconductor device comprising:
   (1) epitaxially forming an electrically conducting thin film layer on a single crystalline substrate having through holes, epitaxially forming, on said electrically conducting thin film layer, ferroelectric single crystalline thin film containing Pb and having a plane (111) in parallel with the surface of the substrate, patterning said electrically conducting thin film layer and said ferroelectric thin film layer to thereby form isolated ferroelectric thin films of a predetermined shape and one electrode of a capacitor of a predetermined shape, forming another electrode of the capacitor on said ferroelectric thin film, and forming part of a circuit of a semiconductor device so as to pass through the holes in said single crystalline substrate, to thereby fabricate a single crystalline substrate comprising a capacitor structure constituted by said ferroelectric thin film containing Pb and a pair of electrodes holding the ferroelectric thin film therebetween, and said part of the circuit of the semiconductor device;
   (2) fabricating a semiconductor substrate having another circuit of the semiconductor device formed; and
   (3) bonding said single crystalline substrate to said semiconductor substrate to couple the circuits of the two substrates together.

2. A method of producing a semiconductor device according to claim 1, wherein said ferroelectric material is PZT ($PbZr_xTi_{1-x}O_3$), PLZT ($Pb_yLa_{1-y}Zr_xTi_{1-x}O_3$), PLCSZT ((Pb, La, Ca, Sr)(Zr, Ti)$O_3$) or a substance derived therefrom by adding Nb thereto.

3. A method of producing a semiconductor device according to claim 1, wherein as said single crystalline substrate, a single crystalline substrate having a plane (111) on which the ferroelectric thin film is to be formed, or a single crystalline substrate having an offset angle from the plane (111) is used.

4. A method of producing a semiconductor device according to claim 3, wherein said single crystalline substrate is an MgO or $SrTiO_3$ single crystalline substrate.

5. A method of producing a semiconductor device according to claim 1, wherein as said single crystalline substrate, an $\alpha$-$Al_2O_3$ single crystalline substrate having a plane (0001) on which the ferroelectric thin film is to be formed, or an $\alpha$-$Al_2O_3$ single crystalline substrate having an offset angle from the plane (0001), is used.

6. A method of producing a semiconductor device according to claim 1, wherein as said single crystalline substrate an $MgAl_2O_4$ single crystalline substrate having a plane (001) on which the ferroelectric thin film is to be formed, is used.

7. A method of producing a semiconductor device according to claim 1, wherein as said single crystalline substrate a single crystalline silicon substrate having a plane {111} on which the ferroelectric thin film is to be formed or a single crystalline silicon substrate having an offset angle from the plane {111}, is used.

8. A method of producing a semiconductor device according to claim 7, wherein said ferroelectric thin film is epitaxially grown directly on the ferroelectric thin film-forming surface of said single crystalline substrate.

9. A method of producing a semiconductor device according to claim 7, wherein said ferroelectric thin film is epitaxially grown through a buffer layer formed on the ferroelectric thin film-forming surface of said single crystalline substrate.

10. A method of producing a semiconductor device according to claim 9, wherein said buffer layer is formed of MgO, yttrium-stabilized zirconia, $MgAl_2O_4$, CaO, $SrTiO_3$ or $CeO_2$, and said ferroelectric thin film is grown on the plane (111) or the plane (0001) thereof.

11. A method of producing a semiconductor device according to claim 1, wherein as said single crystalline substrate, a single crystalline silicon substrate having a plane {100} on which the ferroelectric thin film is to be formed, or a single crystalline silicon substrate having an offset angle from the plane {100}, is used.

* * * * *